(12) United States Patent
Lee et al.

(10) Patent No.: US 9,034,561 B2
(45) Date of Patent: May 19, 2015

(54) PHOTOSENSITIVE COMPOSITION COMPRISING AN ACRYLATE COMPOUND

(75) Inventors: Keon Woo Lee, Daejeon (KR); Sang Kyu Kwak, Daejeon (KR); Changsoon Lee, Daejeon (KR); Hyehyeon Kim, Seoul (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/988,469

(22) PCT Filed: Nov. 17, 2011

(86) PCT No.: PCT/KR2011/008820
§ 371 (c)(1),
(2), (4) Date: May 20, 2013

(87) PCT Pub. No.: WO2012/067457
PCT Pub. Date: May 24, 2012

(65) Prior Publication Data
US 2013/0244182 A1    Sep. 19, 2013

(30) Foreign Application Priority Data

Nov. 19, 2010    (KR) .................. 10-2010-0115557

(51) Int. Cl.
*G03F 7/033*    (2006.01)
*G03F 7/027*    (2006.01)
*G03F 7/00*    (2006.01)

(52) U.S. Cl.
CPC .............. *G03F 7/033* (2013.01); *G03F 7/027* (2013.01); *G03F 7/0007* (2013.01)

(58) Field of Classification Search
None
See application file for complete search history.

(56) References Cited

U.S. PATENT DOCUMENTS

| 4,332,964 A | 6/1982 | Bellmann et al. | |
| 6,235,851 B1 * | 5/2001 | Ishii et al. | 525/127 |
| 2007/0128548 A1 * | 6/2007 | Kim et al. | 430/281.1 |
| 2010/0048757 A1 | 2/2010 | Okada et al. | |
| 2010/0105793 A1 * | 4/2010 | Lee et al. | 522/39 |
| 2010/0112479 A1 | 5/2010 | Lee et al. | |

FOREIGN PATENT DOCUMENTS

| CN | 101735344 A | | 6/2010 |
| JP | 04059385 A | * | 2/1992 |
| JP | 2006-039140 A | | 2/2006 |
| JP | 2008-105999 A | | 5/2008 |
| JP | 2010-084000 A | * | 4/2010 |
| KR | 10-2006-0035380 A | | 4/2006 |
| KR | 10-2006-0111569 A | | 10/2006 |
| KR | 10-2009-0086954 A | | 8/2009 |
| KR | 10-2010-0050081 A | | 5/2010 |
| WO | 2005056512 A1 | | 6/2005 |

OTHER PUBLICATIONS

English abstract of JP 04059385a graned Feb. 26, 1992, Accession No. 1992:459048, CAPLUS files of American Chemical Society, obtained in SciFInder database, 3 pages.*
English translation of JP,2010084000, A (2010) from machine translation from AIPN Japan Patent Office National Center for Industrial Property Information and Training, generated Sep. 24, 2013, 13 pages.*
Stauss et al, Microelectronic Engineering 67-68 (2003) pp. 818-825.*
Office Action issued in Korean Patent Application No. 10-2011-0120413 on Jun. 19, 2013 along with English translation, 12 pages.
Office Action issued in Taiwanese Application No. 100142590, dated Feb. 20, 2014, 11 pages.
Office Action issued in Japanese Patent Appln. No. 2013-538665 issued Apr. 8, 2014 along with English translation, 9 pages.

* cited by examiner

*Primary Examiner* — Cynthia Hamilton
(74) *Attorney, Agent, or Firm* — Rothwell, Figg, Ernst & Manbeck, P.C.

(57) ABSTRACT

The present invention relates to a photosensitive composition including an acrylate-based compound having an adamantyl structure. It is possible to manufacture an organic thin film that is easily stripped without decreasing the strength of the thin film by using the photosensitive composition.

11 Claims, 1 Drawing Sheet

PHOTOSENSITIVE COMPOSITION COMPRISING AN ACRYLATE COMPOUND

CROSS-REFERENCE TO RELATED APPLICATIONS

This application is a 35 U.S.C. §371 National Phase Entry Application from PCT/KR2011/008820, filed Nov. 17, 2011, and designating the United States, which claims priority to and the benefit of Korean Patent Application No. 10-2010-0115557 filed in the Korean Intellectual Property Office on Nov. 19, 2010, the entire contents of which are incorporated herein by reference.

TECHNICAL FIELD

The present invention relates to a photosensitive composition including an acrylate-based compound that can increase a developing property of a photosensitive composition.

BACKGROUND ART

In manufacturing a color filter of a liquid crystal display diode, a photosensitive composition is used as an essential material. For example, a color pixel exhibiting a color, a black matrix for blocking light, an overcoat for compensating a step between pixels, and a column spacer maintaining a cell-gap of a liquid crystal display diode are all constituted by a thin film layer that is formed of a photosensitive composition by a photolithography process and has a thickness of 5 μm or less. In addition, since the photosensitive composition that is used for a column spacer or an overcoat can also be used for passivation of a thin film transistor layer, a characteristic of the photosensitive composition largely affects productivity and quality of a color filter and a liquid crystal display diode.

After the color filter is manufactured or after a passivation process of the thin film transistor, defects may occur. This may be caused by adhesion of foreign materials floating in the air, or by a minute damage in a thin film layer during storage or in a progress of process. In this case, in the case where defective portions are fine, the portions may be locally treated by applying a repair process, but in the case where the treatment is impossible, a glass substrate having a relatively high cost is regenerated by reworking the color filter or thin film transistor substrate. Since chemicals used in the reworking are mostly toxic, glass should be regenerated at a temperature that is as low as possible or for a short treatment period of time.

However, if the thin film is formed softly in order to advantageously perform the reworking, there may be problems in that the thin film is easily damaged or afterimages are formed when the liquid crystal display diode is driven. Accordingly, there is a need to develop a composition that can manufacture a thin film that is easily reworked while strength of the thin film is maintained.

SUMMARY OF THE INVENTION

The present invention has been made in an effort to provide a photosensitive composition including an acrylate-based compound that can manufacture a thin film that is easily stripped without decreasing strength.

An exemplary embodiment of the present invention provides a photosensitive composition, including: a binder resin including an alkali soluble polymer resin; a crosslinking compound; a photopolymerization initiator; an acrylate-based compound represented by the following Formula 1; and a solvent.

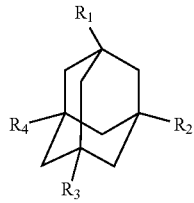

[Formula 1]

wherein
at least one of $R_1$ to $R_4$ is represented by the following Formula 2, Formula 3, Formula 4, or Formula 5, and
the rest are selected from the group consisting of hydrogen, a halogen group, an alkyl group having 1 to 5 carbon atoms, an alkoxy group having 1 to 5 carbon atoms, and a haloalkyl group having 1 to 5 carbon atoms,

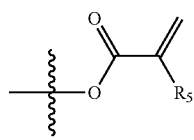

[Formula 2]

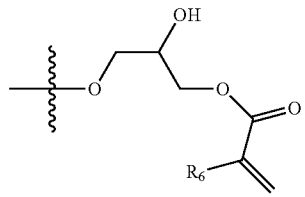

[Formula 3]

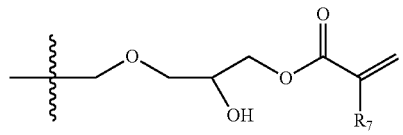

[Formula 4]

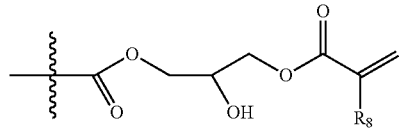

[Formula 5]

wherein
$R_5$, $R_6$, $R_7$ and $R_8$ are the same as or different from each other, and each independently hydrogen, or an alkyl group having 1 to 5 carbon atoms.

Another exemplary embodiment of the present invention provides a composition for improving a developing property, including: the acrylate-based compound represented by Formula 1.

Yet another exemplary embodiment of the present invention provides a photosensitive material, including: the photosensitive composition.

According to the exemplary embodiment of the present invention, an acrylate-based compound may be more usefully applied to a photosensitive composition by including at least one acrylate group with an adamantyl structure as the center. The photosensitive composition according to the exemplary embodiment of the present invention may shorten the developing time in a photolithography process without decreasing strength of a thin film.

DETAILED DESCRIPTION

Figure 1:
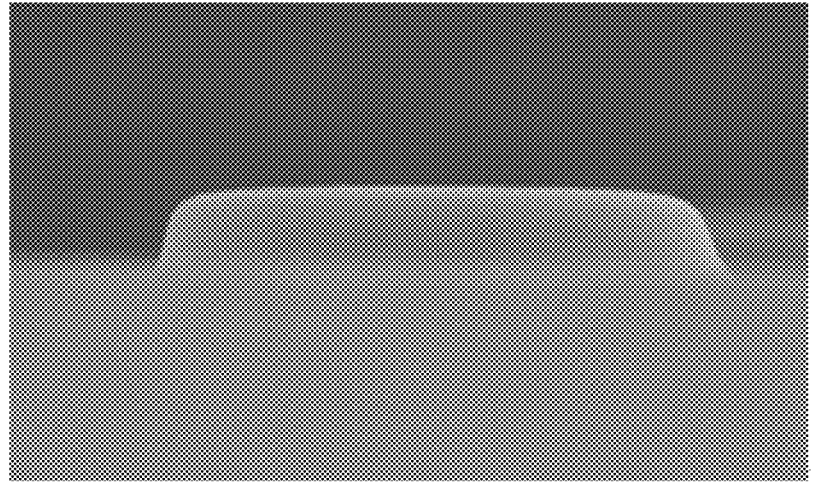
FIG. 1 illustrates results of observing whether a pattern is formed or not by a scanning electron microscope after developing is performed by using a composition of Example 1.

Hereinafter, the present invention will be described in detail.

The photosensitive composition according to the exemplary embodiment of the present invention includes a binder resin including an alkali soluble polymer resin, a crosslinking compound including two or more unsaturated acryl groups, a photopolymerization initiator, an acrylate-based compound represented by Formula 1, and a solvent.

The acrylate-based compound represented by Formula 1 includes at least one acrylate group with an adamantyl structure as the center.

In the acrylate-based compound according to the exemplary embodiment of the present invention, substituent groups of Formula 1 will be described in more detail below. As the halogen group, there may be —F, —Cl, —Br, and —I, but the group is not limited thereto.

The alkyl group may be a straight or branched chain, and the number of carbon atoms is not particularly limited but is preferably 1 to 5. As specific examples thereof, there are a methyl group, an ethyl group, a propyl group, an isopropyl group, a butyl group, and a t-butyl group, but the examples are not limited thereto.

The alkoxy group may have 1 to 5 carbon atoms, and specifically, there may be methoxy, ethoxy, and isopropyloxy, but the group is not limited thereto.

The haloalkyl group may have 1 to 5 carbon atoms, and means a functional group in which one or more hydrogens of the alkyl group are substituted by the halogen group.

In addition, the composition for improving a developing property according to the exemplary embodiment of the present invention includes the acrylate-based compound represented by Formula 1.

The composition for improving a developing property may be a photosensitive composition as described above.

In Formula 1, $R_1$ and $R_2$ are each independently represented by Formula 2, Formula 3, Formula 4, or Formula 5, and $R_3$ and $R_4$ may be hydrogen, but are not limited thereto.

In the acrylate-based compound according to the exemplary embodiment of the present invention, specifically, Formula 1 may be represented by any one of the following Formula 6 to Formula 13.

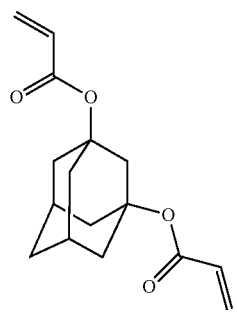

[Formula 6]

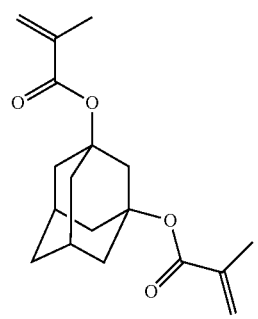

[Formula 7]

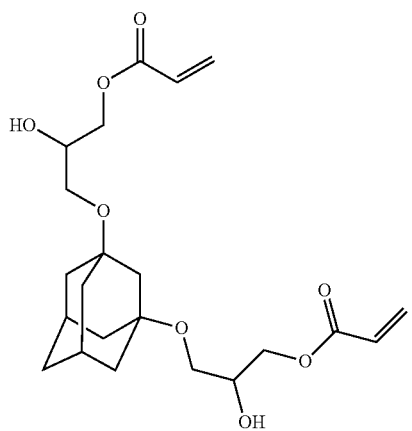

[Formula 8]

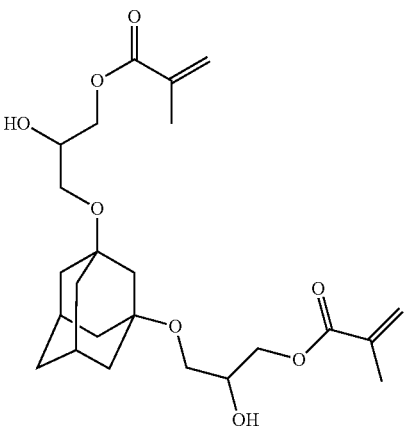

[Formula 9]

-continued

[Formula 10]
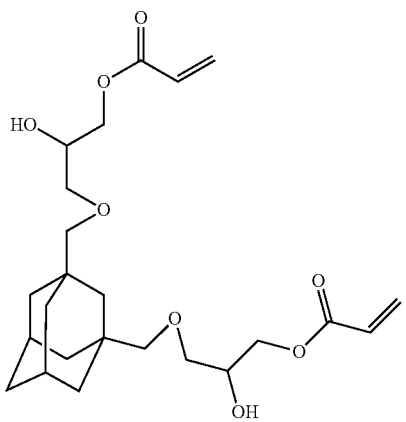

[Formula 11]
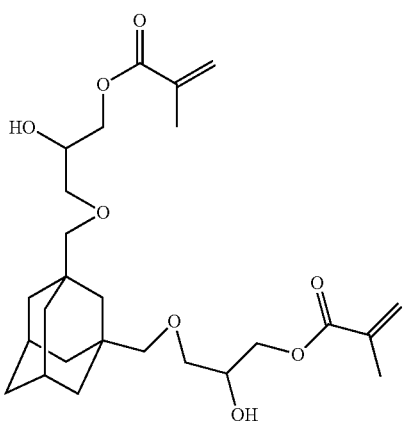

[Formula 12]
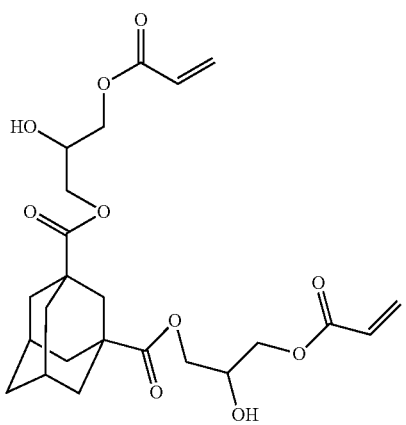

[Formula 13]
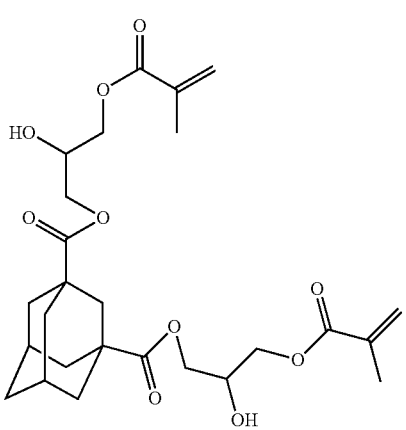

Since the central structure of the molecule of the acrylate-based compound according to the exemplary embodiment of the present invention has a bulky multicyclic shape, when a neutralization reaction is progressed by mixing the polymer thin film and the alkali developing solution and the thin film is dissolved, the molecules in the thin film are allowed to be more easily separated from each other.

According to the exemplary embodiment of the present invention, the acrylate-based compound may be more usefully applied to the photosensitive composition by including at least one acrylate group with the adamantyl structure as the center. The photosensitive composition according to the exemplary embodiment of the present invention may shorten the developing time in a photolithography process without decreasing the strength of the thin film.

In the photosensitive composition according to the exemplary embodiment of the present invention, the content of the acrylate-based compound represented by Formula 1 is preferably 0.8 to 4 wt % on the basis of the total weight of the photosensitive composition. In the case where the content of the acrylate-based compound represented by Formula 1 is 0.8 wt % or more on the basis of the total weight of the photosensitive composition, an improving effect in stripping is good, and in the case where the content is 4 wt % or less, there is an effect of preventing a decrease in strength of the thin film.

In the photosensitive composition according to the exemplary embodiment of the present invention, the content of the acrylate-based compound represented by Formula 1 is preferably 5 to 25 wt %, and specifially 5 to 20 wt % on the basis of the weight of the crosslinking compound. In the case where the content of the acrylate-based compound represented by Formula 1 is 5 wt % or more on the basis of the weight of the crosslinking compound, an improving effect in stripping is good, and in the case where the content is 25 wt % or less, there is an effect of preventing a decrease in strength of the thin film.

Since the photosensitive composition according to the exemplary embodiment of the present invention includes the binder resin, there is an effect of controlling viscosity and there is an effect of making patterning using an alkali developing solution possible.

As the binder resin, matters such as an alkali soluble binder resin, which are generally used in the art may be used. Specifically, an acryl-based binder resin including a carboxyl group may be used, and more specifically, a matter that is configured by copolymerizing a monomer providing mechanical strength of the film and a monomer providing alkali solubility may be used.

As the monomer that can be used for controlling mechanical strength of the film, for example, one or more selected from unsaturated ester carboxylates such as benzyl(metha)acrylate, methyl(metha)acrylate, ethyl(metha)acrylate, butyl(metha)acrylate, dimethylaminoethyl(metha)acrylate, isobutyl(metha)acrylate, t-butyl(metha)acrylate, cyclohexyl(metha)acrylate, isobonyl(metha)acrylate, ethylhexyl(metha)acrylate, 2-phenoxyethyl(metha)acrylate, tetrahydrofurfuryl(metha)acrylate, hydroxyethyl(metha)acrylate, 2-hydroxypropyl(metha)acrylate, 2-hydroxy-3-chloropropyl(metha)acrylate, 4-hydroxybutyl(metha)acrylate, glycerol(metha)acrylate, 2-methoxyethyl(metha)acrylate, 3-methoxybutyl(metha)acrylate, ethoxydiethyleneglycol(metha)acrylate, methoxytriethyleneglycol(metha)acrylate, methoxytripropyleneglycol(metha)acrylate, poly(ethylene glycol)methylether(metha)acrylate, phenoxydiethyleneglycol(metha)acrylate, p-nonylphenoxypolyethyleneglycol(metha)acrylate, p-nonylphenoxypolypropyleneglycol(metha)acrylate, glycidyl (metha)acrylate, dicyclopentanyl(metha)acrylate, dicyclopentenyl(metha)acrylate, dicyclopentenyloxyethyl(metha)acrylate, isobonyl(metha)acrylate, adamentyl(metha)acrylate, stearyl(metha)acrylate, hexyl(metha)acrylate, heptyl(metha)acrylate, oxyl(metha)acrylate, nonyl(metha)acrylate, decyl(metha)acrylate, laurylmethacrylate, methyl α-hydroxymethyl acrylate, ethyl α-hydroxymethyl acrylate, propyl α-hydroxymethyl acrylate, and butyl α-hydroxymethyl acrylate may be used, but the monomer is not limited thereto.

As the monomer providing alkali solubility, for example, one or more selected from the group consisting of (metha)acrylic acid, crotonic acid, itaconic acid, maleic acid, fumaric acid, monomethyl maleic acid, 5-nobonen-2-carboxylic acid, mono-2-((metha)acryloyloxy)ethyl phthalate, mono-2-((metha)acryloyloxy)ethyl succinate, and co-carboxypolycaprolactone mono(metha)acrylate are preferably used, but the monomer is not limited thereto.

In addition, for the binder resin, specifically, a weight average molecular weight may be 3,000 to 150,000. If the molecular weight is 3,000 or more, there is an effect of preventing the pattern from being lost during the developing process, and if the molecular weight is less than 150,000, there is an effect of preventing a problem that it is difficult to perform coating because viscosity is increased.

The content of the binder resin may be 1 to 20 wt % on the basis of the total weight of the photosensitive composition, but is not limited thereto. If the content of the binder resin is 1 wt % or more, there is an effect in which pattern can be performed by using the alkali aqueous solution, if the content is less than 20 wt %, there is an effect of preventing the pattern from being lost during the developing process.

In the photosensitive composition according to the exemplary embodiment of the present invention, as the crosslinking compound, specifically, a crosslinking compound including an ethylene-based unsaturated group may be used, more specifically, a crosslinking compound including two or more unsaturated acryl groups, and a crosslinking compound including three or more unsaturated acryl groups may be used. Specific examples thereof may include one or more selected from the group consisting of a compound that is obtained by esterifying polyvalent alcohol such as ethyleneglycol di(metha)acrylate, polyethylene glycol di(metha)acrylate in which the number of ethylene groups is 2 to 14, trimethylolpropane di(metha)acrylate, trimethylolpropane tri(metha)acrylate, pentaerythritol tri(metha)acrylate, pentaerythritol tetra(metha)acrylate, 2-trisacryloyloxymethylethyl phthalate, propylene glycol di(metha)acrylate in which the number of propylene groups is 2 to 14, dipentaerythritol penta(metha)acrylate, dipentaerythritol hexa(metha)acrylate, and a mixture of an acidic denatured material of dipentaerythritol penta(metha)acrylate and dipentaerythritol hexa(metha)acrylate (trademark: TO-2348, and TO-2349 manufactured by Toagosei Co., Ltd. in Japan) by a α,β-unsaturated carboxylic acid; a compound that is obtained by adding a (metha)acrylic acid to a compound including a glycidyl group such as an addition product of trimethylolpropane triglycidyletheracrylic acid and an addition product of bisphenol A diglycidyletheracrylic acid; an addition product of a hydroxyl group such as diester phthalate of β-hydroxyethyl(metha)acrylate and an addition product of toluene diisocyanate of β-hydroxyethyl (metha)acrylate, or an addition product of a compound having an ethylene unsaturated bond and an ester compound with polyvalent carboxylic acid or polyisocyanate; (metha)acrylate alkylester such as methyl (metha)acrylate, ethyl(metha)acrylate, butyl(metha)acrylate, and 2-ethylhexyl(metha)acrylate; and 9,9'-bis[4-(2-acryloyloxyethoxy)phenyl]fluorine, but are not limited thereto, and general matters that are known in the art may be used. In some cases, silica dispersion element may be used in these compounds, for example, there are Nanocryl XP series (0596, 1045, 21/1364) and Nanopox XP series (0516, 0525) manufactured by Hanse Chemie Co., Ltd.

The content of the crosslinking compound may be 1 to 30 wt % on the basis of the total weight of the photosensitive composition, but is not limited thereto.

In the photosensitive composition according to the exemplary embodiment of the present invention, as the photopolymerization initiator, for example, a triazine-based compound such as 2,4-trichloromethyl-(4'-methoxyphenyl)-6-triazine, 2,4-trichloromethyl-(4'-methoxystyryl)-6-triazine, 2,4-trichloromethyl-(fipronil)-6-triazine, 2,4-trichloromethyl-(3',4'-dimethoxyphenyl)-6-triazine, 3-{4-[2,4-bis(trichloromethyl)-s-triazine-6-yl]phenylthio}propanoic acid, 2,4-trichloromethyl-(4'-ethylbiphenyl)-6-triazine, and 2,4-trichloromethyl-(4'-methylbiphenyl)-6-triazine; a biimidazole compound such as 2,2'-bis(2-chlorophenyl)-4,4',5,5'-tetraphenyl biimidazole, and 2,2'-bis(2,3-dichlorophenyl)-4,4',5,5'-tetraphenylbiimidazole; an acetophenone-based compound such as 2-hydroxy-2-methyl-1-phenylpropane-1-one, 1-(4-isopropylphenyl)-2-hydroxy-2-methylpropane-1-one, 4-(2-hydroxyethoxy)-phenyl (2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propane-1-one(Irgacure-907), and 2-benzyl-2-dimethylamino-1-(4-morpholinophenyl)-butane-1-one (Irgacure-369); an O-acyloxime-based compound such as Irgacure OXE 01 and Irgacure OXE 02 manufactured by Ciba Geigy Co., Ltd.; a benzophenone-based compound such as 4,4'-bis(dimethylamino)benzophenone, and 4,4'-bis(diethylamino)benzophenone; a thioxantone-based compound such as 2,4-diethyl thioxantone, 2-chloro thioxantone, isopropyl thioxantone, diisopropyl thioxantone; a phosphine oxide-based compound such as 2,4,6-trimethylbenzoyl diphenylphosphine oxide, bis(2,6-dimethoxybenzoyl)-2,4,4-trimethylpentyl phosphine oxide, and bis(2,6-dichlorobenzoyl) propyl phosphine oxide; and a coumarine-based compound such as 3,3'-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine, and 10,10'-carbonylbis[1,1,7,7-tetramethyl-2,3,6,7-tetrahydro-1H,5H,11H—Cl]-benzopyrano[6,7,8-ij]-quinolizine-11-one may be used alone or in a mixture of two or more.

The content of the photopolymerization initiator may be 0.1 to 5 wt % on the basis of the total weight of the photosensitive composition, but is not limited thereto.

The solvent, for example, may include one or more selected from the group consisting of methyl ethyl ketone, methyl cellosolve, ethyl cellosolve, ethyleneglycol dimethyl ether, ethyleneglycol diethyl ether, propyleneglycol dimethyl ether, propyleneglycol diethyl ether, diethyleneglycol dimethylether, diethyleneglycol diethylether, diethyleneglycol methyl ethyl ether, 2-ethoxy propanol, 2-methoxy propanol, 3-methoxy butanol, cyclohexanone, cyclopentanone, propyleneglycol methyl ether acetate, propyleneglycol ethyl ether acetate, 3-methoxybutyl acetate, ethyl 3-ethoxypropionate, ethyl cellosolveacetate, methyl cellosolveacetate, butyl acetate, and dipropyleneglycol monomethyl ether, but is not necessarily limited thereto.

The content of the solvent may be 45 to 95 wt % on the basis of the total weight of the photosensitive composition, but is not limited thereto.

In addition, the photosensitive composition according to the exemplary embodiment of the present invention may further include one or more selected from the group consisting of a colorant, a curing accelerator, a thermal polymerization inhibitor, a surfactant, a photosensitizer, a plasticizer, an adhesion promoter, a filler, and an adhesive preparation according to the purpose.

As the colorant, one or more pigments, dyes, or mixtures thereof may be used. Specifically, as a black pigment, metal oxide such as carbon black, graphite, and titanium black may be used. As examples of the carbon black, there are Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF manufactured by Donghae Carbon Co., Ltd.; Diagram black II, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B manufactured by Mitsubishi Chemical Co., Ltd.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 manufactured by Daegussa Co., Ltd.; and RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 manufactured by Columbia Carbon Co., Ltd., or a mixture thereof. In addition, as examples of the colorant exhibiting a color, there are carmine 6B (C.I. 12490), phthalocyanine green (C.I. 74260), phthalocyanine blue (C.I. 74160), perylene black (BASF K0084. K0086), cyanine black, linol yellow (C.I. 21090), linol yellow GRO (C.I. 21090), benzidine yellow 4T-564D, victoria pure blue (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, and 272; C.I. PIGMENT GREEN 7, 36; C.I. PIGMENT blue 15:1, 15:3, 15:4, 15:6, 16, 22, 28, 36, 60, and 64; C.I. PIGMENT yellow 13, 14, 35, 53, 83, 93, 95, 110, 120, 138, 139, 150, 151, 154, 175, 180, 181, 185, 194, and 213; and C.I. PIGMENT VIOLET 15, 19, 23, 29, 32, and 37, and in addition to this, a white pigment and a fluorescent pigment may be used. As the phthalocyanine-based complex compound used as the pigment, a material in which zinc is used as the central metal other than copper may be used.

The curing accelerator, for example, may include one or more selected from the group consisting of 2-mercaptobenzoimidazole, 2-mercaptobenzothiazole, 2-mercaptobenzoxazole, 2,5-dimercapto-1,3,4-thiadiazole, 2 mercapto-4,6-dimethylaminopyrydine, pentaerythritol tetrakis(3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate), but is not limited thereto, and may include matters that are generally known in the art.

The thermal polymerization inhibitor, for example, may include one or more selected from the group consisting of p-anisole, hydroquinone, pyrocatechol, t-butyl catechol, N-nitrosophenylhydroxyamine ammonium salt, N-nitrosophenylhydroxyamine aluminum salt, and phenothiazine, but is not limited thereto, and may include matters that are generally known in the art.

As the surfactant, photosensitizer, plasticizer, adhesion promoter, and filler, all compounds that can be included in a known photosensitive resin composition may be used.

The content of the colorant is preferably 1 to 20 wt % on the basis of the total weight of the photosensitive composition, and the contents of the other additives are each independently preferably 0.01 to 5 weight on the basis of the total weight of the photosensitive composition, but are not limited thereto.

Meanwhile, a transparent photosensitive composition according to the exemplary embodiment of the present invention is used in a roll coater, a curtain coater, a spin coater, a slot die coater, and various printings and precipitations, and may be applied on a support of metal, paper, glass, and plastic substrates. In addition, the composition may be transferred on the other support after being coated on the support such as a film, or may be transferred on a blanket after being coated on a first support and transferred on a second support again, but the application method thereof is not particularly limited.

As a light source for curing the transparent photosensitive composition of the present invention, for example, there are a mercury vapor arc, a carbon arc, and a Xe arc emitting light having a wavelength of 250 to 450 nm, but the light source is not limited thereto.

In the case where the photosensitive composition of the exemplary embodiment of the present invention forms a thin film by being applied to a board, strength of the thin film is 0.21 GPa or more, and specifically, 0.24 GPa or more. If the strength of the thin film is 0.21 GPa or more, an effect of the thin film may be obtained, and if the strength is 0.24 GPa or more, the thin film is more excellent. Accordingly, when the thin film is formed by the photosensitive composition according to the exemplary embodiment of the present invention, there is an effect that stripping is easily performed without decreasing the strength of the thin film. The board includes, for example, a support such as metal, paper, glass, and plastic substrates, but is not limited thereto.

The photosensitive composition according to the exemplary embodiment of the present invention may be selected from the group consisting of a photosensitive composition for photoacryl, a photosensitive composition for a touch panel protection material, a photosensitive composition for a TFT LCD color filter, a black matrix photosensitive composition of a TFT LCD or organic light emitting diode, a photosensitive composition for an overcoat layer, a photosensitive composition for a column spacer, a photosensitive composition for a photocurable paint, a photosensitive composition for photocurable ink, a photosensitive composition for a photocurable adhesive agent, a photosensitive composition for a printed board, and a photosensitive composition for a printed circuit board, but is not limited thereto.

The photosensitive composition according to the exemplary embodiment of the present invention may be used as a photosensitive material selected from the group consisting of a photosensitive material for photoacryl, a photosensitive material for a touch panel protection material, a pigment dispersion type photosensitive material for manufacturing a TFT LCD color filter, a photosensitive material for forming a black matrix of a TFT LCD or organic light emitting diode (OLED), a photosensitive material for forming an overcoat layer of an LCD or OLED, a column spacer photosensitive material, a photosensitive material for a printed board or printed circuit board, and a transparent photosensitive material. In addition, the composition may be used in manufacturing PDP, and as partition materials for OLED and LED lighting, but the purpose thereof is not particularly limited.

Hereinafter, preferable Examples, Comparative Examples, and Test examples will be described in order to help understand the present invention. However, the following Examples, Comparative Examples, and Test examples are set forth to illustrate the present invention, but the scope of the present invention is not limited thereto.

EXAMPLE

Example 1

The following photosensitive compositions were manufactured in order to confirm the effect of the exemplary embodiment of the present invention. 8 parts by weight of the binder BzMA/MAA (molar ratio: 70/30, Mw: 24,000) formed of the alkali soluble resin, 16 parts by weight of the dipentaerythritol hexaacrylate compound as the crosslinking compound, 1 part by weight of Irgacure 369 (2-benzyl-2-dimethylamino-1-(4-morpholinophenyl)-butane-1-one) manufactured by Ciba-Geigy Co., Ltd. as the photopolymerization initiator, 0.8 parts by weight (5% of the crosslinking compound) of the acrylate-based compound represented by Formula 6, and PGMEA which was the organic solvent were put so that the total content was 100 parts by weight, and mixed by using the shaker for 3 hours to form the solution, and the solution was filtered with the filter of 5 microns.

Example 2

The same manner as Example 1 was performed, except that 1.6 parts by weight (10% of the crosslinking compound) of the acrylate-based compound was used instead of 0.8 parts by weight (5% of the crosslinking compound) of the acrylate-based compound represented by Formula 6 in Example 1.

Example 3

The same manner as Example 1 was performed, except that 2.4 parts by weight (15% of the crosslinking compound) of the acrylate-based compound was used instead of 0.8 parts by weight (5% of the crosslinking compound) of the acrylate-based compound represented by Formula 6 in Example 1.

Example 4

The same manner as Example 1 was performed, except that 3.2 parts by weight (20% of the crosslinking compound) of the acrylate-based compound was used instead of 0.8 parts by weight (5% of the crosslinking compound) of the acrylate-based compound represented by Formula 6 in Example 1.

Example 5

The same manner as Example 1 was performed, except that 4.0 parts by weight (25% of the crosslinking compound) of the acrylate-based compound was used instead of 0.8 parts by weight (5% of the crosslinking compound) of the acrylate-based compound represented by Formula 6 in Example 1.

Example 6

The same manner as Example 1 was performed, except that 0.8 parts by weight (5% of the crosslinking compound) of the acrylate-based compound represented by Formula 7 was used instead of 0.8 parts by weight (5% of the crosslinking compound) of the acrylate-based compound represented by Formula 6 in Example 1.

Example 7

The same manner as Example 1 was performed, except that 1.6 parts by weight (10% of the crosslinking compound) of the acrylate-based compound represented by Formula 7 was used instead of 0.8 parts by weight (5% of the crosslinking compound) of the acrylate-based compound represented by Formula 6 in Example 1.

Example 8

The same manner as Example 1 was performed, except that 2.4 parts by weight (15% of the crosslinking compound) of the acrylate-based compound represented by Formula 7 was used instead of 0.8 parts by weight (5% of the crosslinking compound) of the acrylate-based compound represented by Formula 6 in Example 1.

Example 9

The same manner as Example 1 was performed, except that 3.2 parts by weight (20% of the crosslinking compound) of the acrylate-based compound represented by Formula 7 was used instead of 0.8 parts by weight (5% of the crosslinking compound) of the acrylate-based compound represented by Formula 6 in Example 1.

Example 10

The same manner as Example 1 was performed, except that 4.0 parts by weight (25% of the crosslinking compound) of the acrylate-based compound represented by Formula 7 was used instead of 0.8 parts by weight (5% of the crosslinking compound) of the acrylate-based compound represented by Formula 6 in Example 1.

Example 11

The same manner as Example 1 was performed, except that 0.8 parts by weight (5% of the crosslinking compound) of the acrylate-based compound represented by Formula 8 was used instead of 0.8 parts by weight (5% of the crosslinking compound) of the acrylate-based compound represented by Formula 6 in Example 1.

Example 12

The same manner as Example 1 was performed, except that 1.6 parts by weight (10% of the crosslinking compound) of the acrylate-based compound represented by Formula 8 was used instead of 0.8 parts by weight (5% of the crosslinking compound) of the acrylate-based compound represented by Formula 6 in Example 1.

Example 13

The same manner as Example 1 was performed, except that 2.4 parts by weight (15% of the crosslinking compound) of the acrylate-based compound represented by Formula 8 was used instead of 0.8 parts by weight (5% of the crosslinking compound) of the acrylate-based compound represented by Formula 6 in Example 1.

Example 14

The same manner as Example 1 was performed, except that 3.2 parts by weight (20% of the crosslinking compound) of the acrylate-based compound represented by Formula 8 was used instead of 0.8 parts by weight (5% of the crosslinking compound) of the acrylate-based compound represented by Formula 6 in Example 1.

Example 15

The same manner as Example 1 was performed, except that 4.0 parts by weight (25% of the crosslinking compound) of the acrylate-based compound represented by Formula 8 was used instead of 0.8 parts by weight (5% of the crosslinking compound) of the acrylate-based compound represented by Formula 6 in Example 1.

Example 16

The same manner as Example 1 was performed, except that 0.8 parts by weight (5% of the crosslinking compound) of the acrylate-based compound represented by Formula 9 was used instead of 0.8 parts by weight (5% of the crosslinking compound) of the acrylate-based compound represented by Formula 6 in Example 1.

Example 17

The same manner as Example 1 was performed, except that 1.6 parts by weight (10% of the crosslinking compound) of the acrylate-based compound represented by Formula 9 was used instead of 0.8 parts by weight (5% of the crosslinking compound) of the acrylate-based compound represented by Formula 6 in Example 1.

Example 18

The same manner as Example 1 was performed, except that 2.4 parts by weight (15% of the crosslinking compound) of the acrylate-based compound represented by Formula 9 was used instead of 0.8 parts by weight (5% of the crosslinking compound) of the acrylate-based compound represented by Formula 6 in Example 1.

Example 19

The same manner as Example 1 was performed, except that 3.2 parts by weight (20% of the crosslinking compound) of the acrylate-based compound represented by Formula 9 was used instead of 0.8 parts by weight (5% of the crosslinking compound) of the acrylate-based compound represented by Formula 6 in Example 1.

Example 20

The same manner as Example 1 was performed, except that 4.0 parts by weight (25% of the crosslinking compound) of the acrylate-based compound represented by Formula 9 was used instead of 0.8 parts by weight (5% of the crosslinking compound) of the acrylate-based compound represented by Formula 6 in Example 1.

Example 21

The same manner as Example 1 was performed, except that 0.8 parts by weight (5% of the crosslinking compound) of the acrylate-based compound represented by Formula 10 was used instead of 0.8 parts by weight (5% of the crosslinking compound) of the acrylate-based compound represented by Formula 6 in Example 1.

Example 22

The same manner as Example 1 was performed, except that 1.6 parts by weight (10% of the crosslinking compound) of the acrylate-based compound represented by Formula 10 was used instead of 0.8 parts by weight (5% of the crosslinking compound) of the acrylate-based compound represented by Formula 6 in Example 1.

Example 23

The same manner as Example 1 was performed, except that 2.4 parts by weight (15% of the crosslinking compound) of the acrylate-based compound represented by Formula 10 was used instead of 0.8 parts by weight (5% of the crosslinking compound) of the acrylate-based compound represented by Formula 6 in Example 1.

Example 24

The same manner as Example 1 was performed, except that 3.2 parts by weight (20% of the crosslinking compound) of the acrylate-based compound represented by Formula 10 was used instead of 0.8 parts by weight (5% of the crosslinking compound) of the acrylate-based compound represented by Formula 6 in Example 1.

Example 25

The same manner as Example 1 was performed, except that 4.0 parts by weight (25% of the crosslinking compound) of the acrylate-based compound represented by Formula 10 was used instead of 0.8 parts by weight (5% of the crosslinking compound) of the acrylate-based compound represented by Formula 6 in Example 1.

Example 26

The same manner as Example 1 was performed, except that 0.8 parts by weight (5% of the crosslinking compound) of the acrylate-based compound represented by Formula 11 was used instead of 0.8 parts by weight (5% of the crosslinking compound) of the acrylate-based compound represented by Formula 6 in Example 1.

Example 27

The same manner as Example 1 was performed, except that 1.6 parts by weight (10% of the crosslinking compound) of the acrylate compound represented by Formula 11 was used instead of 0.8 parts by weight (5% of the crosslinking compound) of the acrylate-based compound represented by Formula 6 in Example 1.

Example 28

The same manner as Example 1 was performed, except that 2.4 parts by weight (15% of the crosslinking compound) of the acrylate-based compound represented by Formula 11 was used instead of 0.8 parts by weight (5% of the crosslinking compound) of the acrylate-based compound represented by Formula 6 in Example 1.

Example 29

The same manner as Example 1 was performed, except that 3.2 parts by weight (20% of the crosslinking compound) of the acrylate-based compound represented by Formula 11 was used instead of 0.8 parts by weight (5% of the crosslinking compound) of the acrylate-based compound represented by Formula 6 in Example 1.

Example 30

The same manner as Example 1 was performed, except that 4.0 parts by weight (25% of the crosslinking compound) of the acrylate-based compound represented by Formula 11 was used instead of 0.8 parts by weight (5% of the crosslinking compound) of the acrylate-based compound represented by Formula 6 in Example 1.

Example 31

The same manner as Example 1 was performed, except that 0.8 parts by weight (5% of the crosslinking compound) of the acrylate-based compound represented by Formula 12 was used instead of 0.8 parts by weight (5% of the crosslinking compound) of the acrylate-based compound represented by Formula 6 in Example 1.

Example 32

The same manner as Example 1 was performed, except that 1.6 parts by weight (10% of the crosslinking compound) of the acrylate-based compound represented by Formula 12 was used instead of 0.8 parts by weight (5% of the crosslinking compound) of the acrylate-based compound represented by Formula 6 in Example 1.

Example 33

The same manner as Example 1 was performed, except that 2.4 parts by weight (15% of the crosslinking compound) of the acrylate-based compound represented by Formula 12 was used instead of 0.8 parts by weight (5% of the crosslinking compound) of the acrylate-based compound represented by Formula 6 in Example 1.

Example 34

The same manner as Example 1 was performed, except that 3.2 parts by weight (20% of the crosslinking compound) of the acrylate-based compound represented by Formula 12 was used instead of 0.8 parts by weight (5% of the crosslinking compound) of the acrylate-based compound represented by Formula 6 in Example 1.

Example 35

The same manner as Example 1 was performed, except that 4.0 parts by weight (25% of the crosslinking compound) of the acrylate-based compound represented by Formula 12 was used instead of 0.8 parts by weight (5% of the crosslinking compound) of the acrylate-based compound represented by Formula 6 in Example 1.

Example 36

The same manner as Example 1 was performed, except that 0.8 parts by weight (5% of the crosslinking compound) of the acrylate-based compound represented by Formula 13 was used instead of 0.8 parts by weight (5% of the crosslinking compound) of the acrylate-based compound represented by Formula 6 in Example 1.

Example 37

The same manner as Example 1 was performed, except that 1.6 parts by weight (10% of the crosslinking compound) of the acrylate-based compound represented by Formula 13 was used instead of 0.8 parts by weight (5% of the crosslinking compound) of the acrylate-based compound represented by Formula 6 in Example 1.

Example 38

The same manner as Example 1 was performed, except that 2.4 parts by weight (15% of the crosslinking compound) of the acrylate-based compound represented by Formula 13 was used instead of 0.8 parts by weight (5% of the crosslinking compound) of the acrylate-based compound represented by Formula 6 in Example 1.

Example 39

The same manner as Example 1 was performed, except that 3.2 parts by weight (20% of the crosslinking compound) of the acrylate-based compound represented by Formula 13 was used instead of 0.8 parts by weight (5% of the crosslinking compound) of the acrylate-based compound represented by Formula 6 in Example 1.

Example 40

The same manner as Example 1 was performed, except that 4.0 parts by weight (25% of the crosslinking compound) of the acrylate-based compound represented by Formula 13 was used instead of 0.8 parts by weight (5% of the crosslinking compound) of the acrylate-based compound represented by Formula 6 in Example 1.

Example 41

The same manner as Example 1 was performed, except that 0.5 parts by weight (3% of the crosslinking compound) of the acrylate-based compound was used instead of 0.8 parts by weight (5% of the crosslinking compound) of the acrylate-based compound represented by Formula 6 in Example 1.

Example 42

The same manner as Example 1 was performed, except that 5.0 parts by weight (31% of the crosslinking compound) of the acrylate-based compound was used instead of 0.8 parts by weight (5% of the crosslinking compound) of the acrylate-based compound represented by Formula 6 in Example 1.

Example 43

The same manner as Example 1 was performed, except that 0.5 parts by weight (3% of the crosslinking compound) of the acrylate-based compound represented by Formula 7 was used instead of 0.8 parts by weight (5% of the crosslinking compound) of the acrylate-based compound represented by Formula 6 in Example 1.

Example 44

The same manner as Example 1 was performed, except that 5.0 parts by weight (31% of the crosslinking compound) of the acrylate-based compound represented by Formula 7 was used instead of 0.8 parts by weight (5% of the crosslinking compound) of the acrylate-based compound represented by Formula 6 in Example 1.

Example 45

The same manner as Example 1 was performed, except that 0.5 parts by weight (3% of the crosslinking compound) of the acrylate-based compound represented by Formula 8 was used instead of 0.8 parts by weight (5% of the crosslinking compound) of the acrylate-based compound represented by Formula 6 in Example 1.

Example 46

The same manner as Example 1 was performed, except that 5.0 parts by weight (31% of the crosslinking compound) of the acrylate-based compound represented by Formula 8 was used instead of 0.8 parts by weight (5% of the crosslinking compound) of the acrylate-based compound represented by Formula 6 in Example 1.

Example 47

The same manner as Example 1 was performed, except that 0.5 parts by weight (3% of the crosslinking compound) of the acrylate-based compound represented by Formula 9 was used instead of 0.8 parts by weight (5% of the crosslinking compound) of the acrylate-based compound represented by Formula 6 in Example 1.

Example 48

The same manner as Example 1 was performed, except that 5.0 parts by weight (31% of the crosslinking compound) of the acrylate-based compound represented by Formula 9 was used instead of 0.8 parts by weight (5% of the crosslinking compound) of the acrylate-based compound represented by Formula 6 in Example 1.

Example 49

The same manner as Example 1 was performed, except that 0.5 parts by weight (3% of the crosslinking compound) of the acrylate-based compound represented by Formula 10 was used instead of 0.8 parts by weight (5% of the crosslinking compound) of the acrylate-based compound represented by Formula 6 in Example 1.

Example 50

The same manner as Example 1 was performed, except that 5.0 parts by weight (31% of the crosslinking compound) of the acrylate-based compound represented by Formula 10 was used instead of 0.8 parts by weight (5% of the crosslinking compound) of the acrylate-based compound represented by Formula 6 in Example 1.

Example 51

The same manner as Example 1 was performed, except that 0.5 parts by weight (3% of the crosslinking compound) of the acrylate-based compound represented by Formula 11 was used instead of 0.8 parts by weight (5% of the crosslinking compound) of the acrylate-based compound represented by Formula 6 in Example 1.

Example 52

The same manner as Example 1 was performed, except that 5.0 parts by weight (31% of the crosslinking compound) of the acrylate-based compound represented by Formula 11 was used instead of 0.8 parts by weight (5% of the crosslinking compound) of the acrylate-based compound represented by Formula 6 in Example 1.

Example 53

The same manner as Example 1 was performed, except that 0.5 parts by weight (3% of the crosslinking compound) of the acrylate-based compound represented by Formula 12 was used instead of 0.8 parts by weight (5% of the crosslinking compound) of the acrylate-based compound represented by Formula 6 in Example 1.

Example 54

The same manner as Example 1 was performed, except that 5.0 parts by weight (31% of the crosslinking compound) of the acrylate-based compound represented by Formula 12 was used instead of 0.8 parts by weight (5% of the crosslinking compound) of the acrylate-based compound represented by Formula 6 in Example 1.

Example 55

The same manner as Example 1 was performed, except that 0.5 parts by weight (3% of the crosslinking compound) of the acrylate-based compound represented by Formula 13 was used instead of 0.8 parts by weight (5% of the crosslinking compound) of the acrylate-based compound represented by Formula 6 in Example 1.

Example 56

The same manner as Example 1 was performed, except that 5.0 parts by weight (31% of the crosslinking compound) of the acrylate-based compound represented by Formula 13 was used instead of 0.8 parts by weight (5% of the crosslinking compound) of the acrylate-based compound represented by Formula 6 in Example 1.

Comparative Example 1

The same manner as Example 1 was performed, except that 0.8 parts by weight (5% of the crosslinking compound) of the acrylate-based compound represented by Formula 6 was not used in Example 1.

Comparative Example 2

The same manner as Example 1 was performed, except that 8 parts by weight of the binder BzMA/MAA (molar ratio: 70/30, Mw: 24,000) formed of the alkali soluble resin was not used in Example 1.

Comparative Example 3

The same manner as Example 6 was performed, except that 8 parts by weight of the binder BzMA/MAA (molar ratio: 70/30, Mw: 24,000) formed of the alkali soluble resin was not used in Example 6.

Comparative Example 4

The same manner as Example 11 was performed, except that 8 parts by weight of the binder BzMA/MAA (molar ratio: 70/30, Mw: 24,000) formed of the alkali soluble resin was not used in Example 11.

Comparative Example 5

The same manner as Example 16 was performed, except that 8 parts by weight of the binder BzMA/MAA (molar ratio: 70/30, Mw: 24,000) formed of the alkali soluble resin was not used in Example 16.

Comparative Example 6

The same manner as Example 21 was performed, except that 8 parts by weight of the binder BzMA/MAA (molar ratio: 70/30, Mw: 24,000) formed of the alkali soluble resin was not used in Example 21.

Comparative Example 7

The same manner as Example 26 was performed, except that 8 parts by weight of the binder BzMA/MAA (molar ratio: 70/30, Mw: 24,000) formed of the alkali soluble resin was not used in Example 26.

Comparative Example 8

The same manner as Example 31 was performed, except that 8 parts by weight of the binder BzMA/MAA (molar ratio: 70/30, Mw: 24,000) formed of the alkali soluble resin was not used in Example 31.

Comparative Example 9

The same manner as Example 36 was performed, except that 8 parts by weight of the binder BzMA/MAA (molar ratio: 70/30, Mw: 24,000) formed of the alkali soluble resin was not used in Example 36.

Test Example 1

Test of Strength of the Thin Film and Developing Property

After the uniform thin film was formed by coating the photosensitive compositions obtained in the Examples and Comparative Examples by the method such as spin coating, slit coating, dip coating, or doctor blading, the solvent was volatilized by performing the prebake process at 100° C. for 200 sec. The thickness of the dried thin film was about 4 microns. Next, the thin film was exposed under the high voltage mercury lamp by using the photomask constituted by lines having the interval width of 5 microns from 5 to 50 microns. The exposed substrate was developed in the spray manner in the 0.04% KOH aqueous solution at the temperature of 25° C., washed with pure water, and dried by air blowing. Thereafter, the final thin film was formed by performing treatment in the oven maintained at 210° C. for 30 min.

In order to confirm strength of the thin film, an experiment using a press was performed. The strength of the thin film was measured by using Nano-indenter and Berkovich Tip manufactured by MTS Co., Ltd.

In order to confirm a stripping characteristic of the thin film obtained in the above experiment, the stripping solution in which KOH was dissolved in a solution where benzyl alcohol, isopropyl alcohol, and distilled water were mixed at a ratio of 1:39:60 so that the pH was about 14, was used.

After the thin film obtained in the above experiment was dipped in the stripping solution maintained at about 60° C., the time until the thin film was completely removed from glass was measured. The thin film was sealed after being dipped therein in order to minimize a change of the pH of the stripping solution.

The experimental results according to Examples 1 to 56 and Comparative Example 1 are described in the following Table 1.

Comparative Example 1 as the standard experiment is the case where no acrylate-based compound was used. When compared to this, in the case of Examples 1 to 56, the stripping time was shortened according to the content of the acrylate-based compound. This phenomenon is considered to occur because the stripping solution is easily penetrated into the thin film by a bulky characteristic of the adamantyl structure positioned at the center of the acrylate-based compound. In addition, it can be seen that the case where the addition amount is 25% or less and specifically 20% or less on the basis of the crosslinking agent does not largely affect the strength of the thin film.

TABLE 1

| | | Content of the acrylate-based compound | | | |
| --- | --- | --- | --- | --- | --- |
| | Acrylate-based compound | Relative amount on the basis of the crosslinking compound | Weight ratio | Strength of the thin film (GPa) | Stripping time (min) |
| Example 1 | Formula 6 | 5% | 0.8 | 0.29 | 11 |
| Example 2 | Formula 6 | 10% | 1.6 | 0.29 | 9.5 |
| Example 3 | Formula 6 | 15% | 2.4 | 0.29 | 9 |
| Example 4 | Formula 6 | 20% | 3.2 | 0.29 | 8.5 |
| Example 5 | Formula 6 | 25% | 4 | 0.26 | 7.5 |
| Example 6 | Formula 7 | 5% | 0.8 | 0.29 | 10.5 |
| Example 7 | Formula 7 | 10% | 1.6 | 0.29 | 9.5 |
| Example 8 | Formula 7 | 15% | 2.4 | 0.29 | 9 |
| Example 9 | Formula 7 | 20% | 3.2 | 0.29 | 8.5 |
| Example 10 | Formula 7 | 25% | 4 | 0.27 | 7.5 |
| Example 11 | Formula 8 | 5% | 0.8 | 0.29 | 9.5 |
| Example 12 | Formula 8 | 10% | 1.6 | 0.29 | 8.5 |
| Example 13 | Formula 8 | 15% | 2.4 | 0.29 | 8.0 |
| Example 14 | Formula 8 | 20% | 3.2 | 0.29 | 7.5 |
| Example 15 | Formula 8 | 25% | 4 | 0.26 | 6.5 |
| Example 16 | Formula 9 | 5% | 0.8 | 0.29 | 10 |
| Example 17 | Formula 9 | 10% | 1.6 | 0.29 | 9 |
| Example 18 | Formula 9 | 15% | 2.4 | 0.29 | 8.5 |
| Example 19 | Formula 9 | 20% | 3.2 | 0.29 | 7 |
| Example 20 | Formula 9 | 25% | 4 | 0.26 | 6.5 |
| Example 21 | Formula 10 | 5% | 0.8 | 0.29 | 9.5 |
| Example 22 | Formula 10 | 10% | 1.6 | 0.29 | 8.5 |
| Example 23 | Formula 10 | 15% | 2.4 | 0.29 | 8 |
| Example 24 | Formula 10 | 20% | 3.2 | 0.28 | 7 |
| Example 25 | Formula 10 | 25% | 4 | 0.25 | 6 |
| Example 26 | Formula 11 | 5% | 0.8 | 0.29 | 9.5 |

TABLE 1-continued

|  | Acrylate-based compound | Content of the acrylate-based compound | | Strength of the thin film (GPa) | Stripping time (min) |
|---|---|---|---|---|---|
|  |  | Relative amount on the basis of the crosslinking compound | Weight ratio | | |
| Example 27 | Formula 11 | 10% | 1.6 | 0.29 | 8.5 |
| Example 28 | Formula 11 | 15% | 2.4 | 0.29 | 7.5 |
| Example 29 | Formula 11 | 20% | 3.2 | 0.28 | 6.5 |
| Example 30 | Formula 11 | 25% | 4 | 0.24 | 5.5 |
| Example 31 | Formula 12 | 5% | 0.8 | 0.29 | 9 |
| Example 32 | Formula 12 | 10% | 1.6 | 0.29 | 8 |
| Example 33 | Formula 12 | 15% | 2.4 | 0.29 | 7 |
| Example 34 | Formula 12 | 20% | 3.2 | 0.28 | 6.5 |
| Example 35 | Formula 12 | 25% | 4 | 0.26 | 5.5 |
| Example 36 | Formula 13 | 5% | 0.8 | 0.29 | 9 |
| Example 37 | Formula 13 | 10% | 1.6 | 0.29 | 8 |
| Example 38 | Formula 13 | 15% | 2.4 | 0.29 | 7 |
| Example 39 | Formula 13 | 20% | 3.2 | 0.29 | 6.5 |
| Example 40 | Formula 13 | 25% | 4 | 0.27 | 5 |
| Example 41 | Formula 6 | 3% | 0.5 | 0.29 | 12.5 |
| Example 42 | Formula 6 | 31% | 5.0 | 0.22 | 2.5 |
| Example 43 | Formula 7 | 3% | 0.5 | 0.29 | 12 |
| Example 44 | Formula 7 | 31% | 5.0 | 0.23 | 2.5 |
| Example 45 | Formula 8 | 3% | 0.5 | 0.29 | 12 |
| Example 46 | Formula 8 | 31% | 5.0 | 0.23 | 2 |
| Example 47 | Formula 9 | 3% | 0.5 | 0.29 | 12 |
| Example 48 | Formula 9 | 31% | 5.0 | 0.22 | 2 |
| Example 49 | Formula 10 | 3% | 0.5 | 0.29 | 12 |
| Example 50 | Formula 10 | 31% | 5.0 | 0.21 | 2 |
| Example 51 | Formula 11 | 3% | 0.5 | 0.29 | 11.5 |
| Example 52 | Formula 11 | 31% | 5.0 | 0.21 | 2 |
| Example 53 | Formula 12 | 3% | 0.5 | 0.29 | 11.5 |
| Example 54 | Formula 12 | 31% | 5.0 | 0.23 | 1.5 |
| Example 55 | Formula 13 | 3% | 0.5 | 0.29 | 11 |
| Example 56 | Formula 13 | 31% | 5.0 | 0.26 | 1.5 |
| Comparative Example 1 | — | — | — | 0.29 | 13 |

Test Example 2

Test of the Viscosity and Patterning

In order to confirm the viscosity of the photosensitive compositions obtained in Examples and Comparative Examples, the experiment using the capillary viscometer was performed. The viscosity was measured by the ViscoClock manufactured by Schott Co., Ltd.

In addition, in order to confirm the patterning effect, after developing was performed by using the compositions of the Examples and Comparative Examples, whether the pattern was formed or not was observed by using the scanning electron microscope.

The experimental results according to Examples 1 to 56 and Comparative Examples 1 to 9 are described in the following Table 2.

Comparative Examples 2 to 9 as the standard experiment are the case where the binder is not used. In the case where the binder was used, since the viscosity was controlled to 11 to 20 cSt, the thin film could be formed. However, in the case where the binder was not used, since the viscosity was 2.5 cSt, it was difficult to control the viscosity and the thin film could not be formed.

Figure 2:
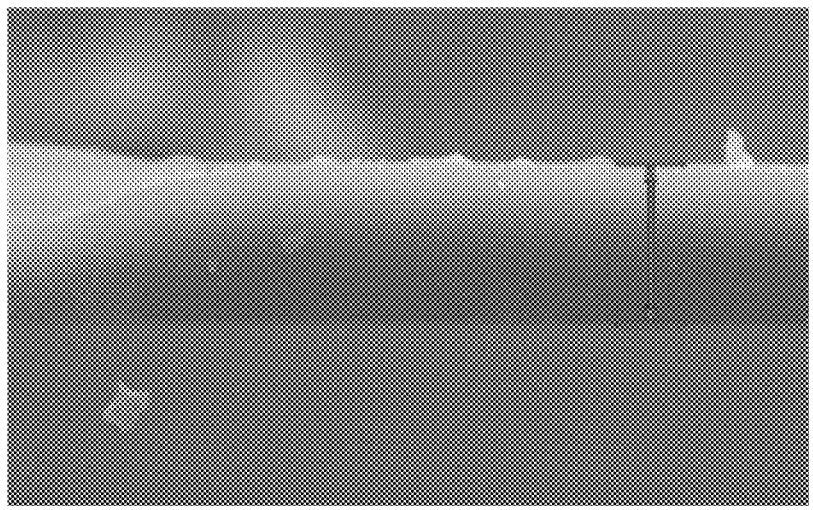
FIG. 2 illustrates results of observing whether a pattern is formed or not by a scanning electron microscope after developing is performed by using a composition of Comparative Example 2, in which a width represented by an arrow is 5.20 μm.

In addition, in the case where the binder was used, the patterning was possible, but in the case where the binder was not used, the patterning was impossible. After developing was performed by using the composition of Example 1, whether the pattern was formed or not was observed by the scanning electron microscope, and the results are illustrated in FIG. 1. In addition, after developing was performed by using the composition of Comparative Example 2, whether the pattern was formed or not was observed by the scanning electron microscope, and the results are illustrated in FIG. 2. FIG. 2 illustrates that it is impossible to form the pattern. In the patterning test of the following Table 2, O means that it is possible to implement the patterning, and X means that it is impossible to implement the patterning.

TABLE 2

| Classification | Acrylate-based compound | Content of the acrylate-based compound (weight ratio) | Use content of the binder (weight ratio) | Viscosity (cSt) | Patterning experiment |
|---|---|---|---|---|---|
| Example 1 | Formula 6 | 0.8 | 8 | 12 | o |
| Example 2 | Formula 6 | 1.6 | 8 | 13 | o |
| Example 3 | Formula 6 | 2.4 | 8 | 14 | o |
| Example 4 | Formula 6 | 3.2 | 8 | 16 | o |
| Example 5 | Formula 6 | 4 | 8 | 18 | o |
| Example 6 | Formula 7 | 0.8 | 8 | 12 | o |
| Example 7 | Formula 7 | 1.6 | 8 | 13 | o |
| Example 8 | Formula 7 | 2.4 | 8 | 14 | o |
| Example 9 | Formula 7 | 3.2 | 8 | 16 | o |
| Example 10 | Formula 7 | 4 | 8 | 18 | o |
| Example 11 | Formula 8 | 0.8 | 8 | 12 | o |
| Example 12 | Formula 8 | 1.6 | 8 | 13 | o |
| Example 13 | Formula 8 | 2.4 | 8 | 14 | o |
| Example 14 | Formula 8 | 3.2 | 8 | 16 | o |
| Example 15 | Formula 8 | 4 | 8 | 18 | o |
| Example 16 | Formula 9 | 0.8 | 8 | 12 | o |
| Example 17 | Formula 9 | 1.6 | 8 | 13 | o |
| Example 18 | Formula 9 | 2.4 | 8 | 14 | o |
| Example 19 | Formula 9 | 3.2 | 8 | 16 | o |
| Example 20 | Formula 9 | 4 | 8 | 18 | o |
| Example 21 | Formula 10 | 0.8 | 8 | 12 | o |
| Example 22 | Formula 10 | 1.6 | 8 | 13 | o |
| Example 23 | Formula 10 | 2.4 | 8 | 14 | o |
| Example 24 | Formula 10 | 3.2 | 8 | 16 | o |
| Example 25 | Formula 10 | 4 | 8 | 18 | o |
| Example 26 | Formula 11 | 0.8 | 8 | 12 | o |
| Example 27 | Formula 11 | 1.6 | 8 | 13 | o |
| Example 28 | Formula 11 | 2.4 | 8 | 14 | o |
| Example 29 | Formula 11 | 3.2 | 8 | 16 | o |
| Example 30 | Formula 11 | 4 | 8 | 18 | o |
| Example 31 | Formula 12 | 0.8 | 8 | 12 | o |
| Example 32 | Formula 12 | 1.6 | 8 | 13 | o |
| Example 33 | Formula 12 | 2.4 | 8 | 14 | o |
| Example 34 | Formula 12 | 3.2 | 8 | 16 | o |
| Example 35 | Formula 12 | 4 | 8 | 18 | o |
| Example 36 | Formula 13 | 0.8 | 8 | 12 | o |
| Example 37 | Formula 13 | 1.6 | 8 | 13 | o |
| Example 38 | Formula 13 | 2.4 | 8 | 14 | o |
| Example 39 | Formula 13 | 3.2 | 8 | 16 | o |
| Example 40 | Formula 13 | 4 | 8 | 18 | o |
| Example 41 | Formula 6 | 0.5 | 8 | 11 | o |
| Example 42 | Formula 6 | 5 | 8 | 18 | o |
| Example 43 | Formula 7 | 0.5 | 8 | 11 | o |
| Example 44 | Formula 7 | 5 | 8 | 19 | o |
| Example 45 | Formula 8 | 0.5 | 8 | 11 | o |
| Example 46 | Formula 8 | 5 | 8 | 19 | o |
| Example 47 | Formula 9 | 0.5 | 8 | 11 | o |
| Example 48 | Formula 9 | 5 | 8 | 19 | o |
| Example 49 | Formula 10 | 0.5 | 8 | 11 | o |
| Example 50 | Formula 10 | 5 | 8 | 19 | o |
| Example 51 | Formula 11 | 0.5 | 8 | 11 | o |
| Example 52 | Formula 11 | 5 | 8 | 18 | o |
| Example 53 | Formula 12 | 0.5 | 8 | 11 | o |
| Example 54 | Formula 12 | 5 | 8 | 19 | o |
| Example 55 | Formula 13 | 0.5 | 8 | 11 | o |
| Example 56 | Formula 13 | 5 | 8 | 19 | o |
| Comparative Example 1 | No | 0 | 8 | 12 | o |

TABLE 2-continued

| Classification | Acrylate-based compound | Content of the acrylate-based compound (weight ratio) | Use content of the binder (weight ratio) | Viscosity (cSt) | Patterning experiment |
|---|---|---|---|---|---|
| Comparative Example 2 | Formula 6 | 0.8 | 0 | 2.5 | x |
| Comparative Example 3 | Formula 7 | 0.8 | 0 | 2.5 | x |
| Comparative Example 4 | Formula 8 | 0.8 | 0 | 2.5 | x |
| Comparative Example 5 | Formula 9 | 0.8 | 0 | 2.5 | x |
| Comparative Example 6 | Formula 10 | 0.8 | 0 | 2.5 | x |
| Comparative Example 7 | Formula 11 | 0.8 | 0 | 2.5 | x |
| Comparative Example 8 | Formula 12 | 0.8 | 0 | 2.5 | x |
| Comparative Example 9 | Formula 13 | 0.8 | 0 | 2.5 | x |

As described above, since the acrylate-based compound according to the exemplary embodiment of the present invention includes at least one acrylate group with the adamantyl structure as the center, the compound may be more usefully applied to the photosensitive composition. The photosensitive composition according to the exemplary embodiment of the present invention may shorten the developing time in the photolithography process without decreasing strength of the thin film.

What is claimed is:

1. A photosensitive composition comprising:
a binder resin including an alkali soluble polymer resin;
a crosslinking compound;
a photopolymerization initiator;
a compound represented by the following Formula 1; and
a solvent:

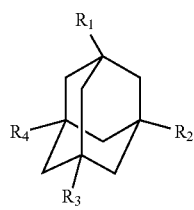

[Formula 1]

wherein
at least one of $R_1$ to $R_4$ is represented by the following Formula 2, Formula 3, Formula 4, or Formula 5, and
the rest are selected from the group consisting of hydrogen, a halogen group, an alkyl group having 1 to 5 carbon atoms, an alkoxy group having 1 to 5 carbon atoms, and a haloalkyl group having 1 to 5 carbon atoms,

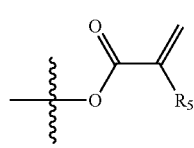

[Formula 2]

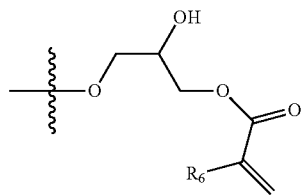

[Formula 3]

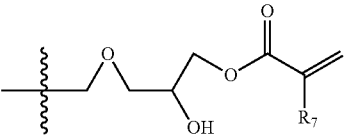

[Formula 4]

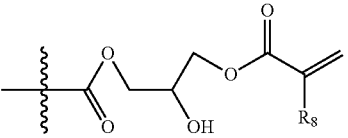

[Formula 5]

wherein
$R_5$, $R_6$, $R_7$ and $R_8$ are the same as or different from each other, and each is independently hydrogen, or an alkyl group having 1 to 5 carbon atoms,
wherein a content of the compound represented by the Formula 1 is 0.8 to 4 wt % on the basis of a total weight of the photosensitive composition, and
wherein a content of the compound represented by the Formula 1 is 5 to 25 wt % on the basis of a weight of the crosslinking compound.

2. The photosensitive composition according to claim 1, wherein $R_1$ and $R_2$ of Formula 1 are each independently represented by Formula 2, Formula 3, Formula 4 or Formula 5, and $R_3$ and $R_4$ are hydrogen.

3. The photosensitive composition according to claim 1, wherein Formula 1 is represented by any one of the following Formula 6 to Formula 13:

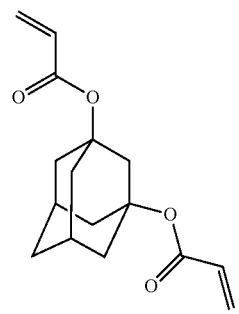

[Formula 6]

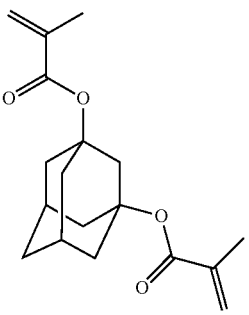

[Formula 7]

[Formula 8]

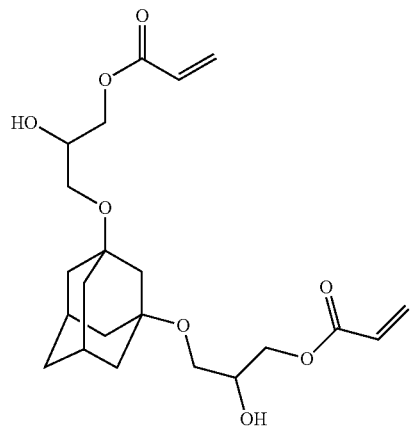

[Formula 9]

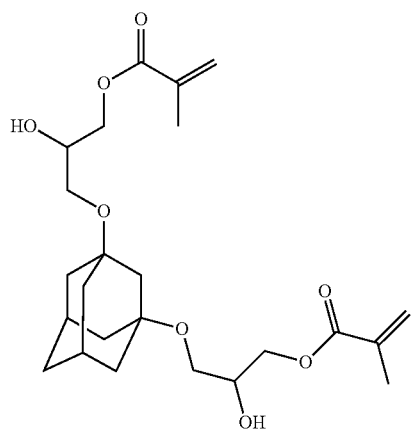

[Formula 10]

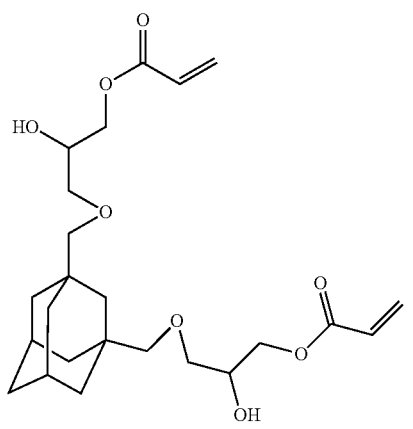

[Formula 11]

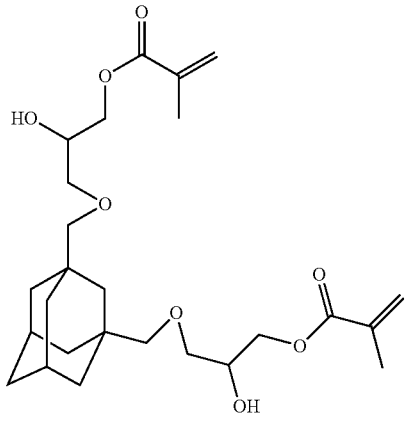

[Formula 12]

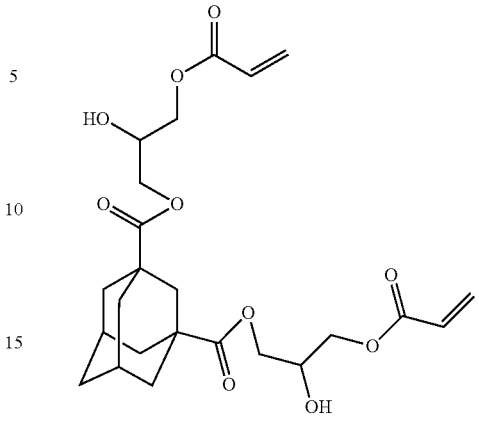

[Formula 13]

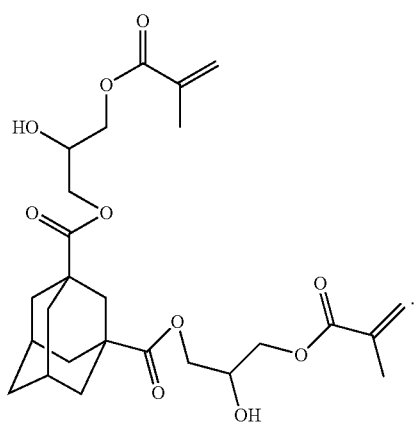

4. The photosensitive composition according to claim 1, wherein the binder resin is an acryl binder resin including a carboxyl group.

5. The photosensitive composition according to claim 1, wherein a content of the binder resin is 1 to 20 wt % on the basis of a total weight of the photosensitive composition.

6. The photosensitive composition according to claim 1, wherein a content of the crosslinking compound is 1 to 30 wt % on the basis of a total weight of the photosensitive composition.

7. The photosensitive composition according to claim 1, wherein a content of the photopolymerization initiator is 0.1 to 5 wt % on the basis of a total weight of the photosensitive composition.

8. The photosensitive composition according to claim 1, wherein a content of the solvent is 45 to 95 wt % on the basis of a total weight of the photosensitive composition.

9. The photosensitive composition according to claim 1, further comprising:
one or more selected from the group consisting of a colorant, a curing accelerator, a thermal polymerization inhibitor, a surfactant, a photosensitizer, a plasticizer, an adhesion promoter, and a filler.

10. The photosensitive composition according to claim 1, wherein the photosensitive composition is selected from the group consisting of a photosensitive composition for a touch panel protection material, a photosensitive composition for a color filter, a black matrix photosensitive composition, a photosensitive composition for an overcoat layer, a photosensitive composition for a column spacer, a photosensitive composition for a photocurable paint, a photosensitive composition for photocurable ink, a photosensitive composition for a photocurable adhesive agent, a photosensitive composition for a printed board, and a photosensitive composition for a printed circuit board.

11. A photosensitive material comprising the photosensitive composition of claim 1, wherein the photosensitive material is selected from the group consisting of a photosensitive material for a touch panel protection material, a pigment dispersion photosensitive material for manufacturing a color filter, a photosensitive material for forming a black matrix, a photosensitive material for forming an overcoat layer, a column spacer photosensitive material, and a photosensitive material for a printed circuit board.

* * * * *